United States Patent

(12) United States Patent (10) Patent No.: US 9,377,700 B2
Schuster et al. (45) Date of Patent: Jun. 28, 2016

(54) DETERMINING POSITION AND CURVATURE INFORMATION DIRECTLY FROM A SURFACE OF A PATTERNING DEVICE

(71) Applicants: ASML Holding N.V., Veldhoven (NL); ASML Netherlands B.V., Veldhoven (NL)

(72) Inventors: Mark Josef Schuster, Fairfield, CT (US); Santiago E. Del Puerto, Milton, NY (US); Daniel Nathan Burbank, Ridgefield, CT (US); Duncan Walter Bromley, Monroe, CT (US); Franciscus Godefridus Casper Bijnen, Valkenswaard (NL)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 141 days.

(21) Appl. No.: 14/357,514

(22) PCT Filed: May 31, 2013

(86) PCT No.: PCT/EP2013/061240
§ 371 (c)(1),
(2) Date: May 9, 2014

(87) PCT Pub. No.: WO2013/178775
PCT Pub. Date: Dec. 5, 2013

(65) Prior Publication Data
US 2014/0307246 A1 Oct. 16, 2014

Related U.S. Application Data

(60) Provisional application No. 61/654,425, filed on Jun. 1, 2012, provisional application No. 61/673,521, filed on Jul. 19, 2012, provisional application No. 61/694,554, filed on Aug. 29, 2012, provisional
(Continued)

(51) Int. Cl.
*G03B 27/32* (2006.01)
*G03B 27/62* (2006.01)
(Continued)

(52) U.S. Cl.
CPC .............. *G03F 7/70775* (2013.01); *G03F 1/14* (2013.01); *G03F 7/707* (2013.01); *G03F 7/7085* (2013.01);
(Continued)

(58) Field of Classification Search
CPC ............. G03F 1/14; G03F 1/142; G03F 1/38; G03F 7/707; G03F 7/70708; G03F 7/70775; G03F 7/70783
USPC ......................................... 355/67, 71, 75, 77
See application file for complete search history.

(56) References Cited

U.S. PATENT DOCUMENTS 5,854,819 A 12/1998 Hara et al.
5,894,056 A 4/1999 Kakizaki et al.
(Continued)

OTHER PUBLICATIONS
International Search Report mailed Jul. 31, 2013 in corresponding International Patent Application No. PCT/EP2013/061240.

*Primary Examiner* — Colin Kreutzer
(74) *Attorney, Agent, or Firm* — Pillsbury Winthrop Shaw Pittman LLP

(57) ABSTRACT

Position and curvature information of a patterning device may be determined directly from the patterning device and controlled based on the determined information. In an embodiment, a lithographic apparatus includes a position determining system operative to determine a relative position of the patterning device. The patterning device may be configured to create a patterned radiation beam from a radiation beam incident on a major surface of the patterning device. The patterning device may have a side surface having an edge in common with the major surface. The position determining system may include an interferometer operative to transmit light to the side surface and to receive the transmitted light after the transmitted light has been reflected at the side surface. The position determining system is operative to determine a quantity representative of the relative position of the patterning device from the received reflected transmitted light.

21 Claims, 22 Drawing Sheets

Related U.S. Application Data application No. 61/695,731, filed on Aug. 31, 2012, provisional application No. 61/697,558, filed on Sep. 6, 2012, provisional application No. 61/721,644, filed on Nov. 2, 2012.

(51) Int. Cl.
*G03F 7/20* (2006.01)
*G03F 1/00* (2012.01)
*G03F 1/38* (2012.01)

(52) U.S. Cl.
CPC ............ *G03F 7/70783* (2013.01); *G03F 1/142* (2013.01); *G03F 1/38* (2013.01); *G03F 7/70708* (2013.01)

(56) References Cited

U.S. PATENT DOCUMENTS

| | | | |
|---|---|---|---|
| 2003/0179354 A1* | 9/2003 | Araki | G03B 27/42 355/53 |
| 2005/0200827 A1 | 9/2005 | Tanaka | |
| 2006/0139595 A1* | 6/2006 | Koenen | B23D 43/04 355/55 |
| 2011/0222039 A1 | 9/2011 | Valentin et al. | |

* cited by examiner

← Nominal

← Reticle bending

DETERMINING POSITION AND CURVATURE INFORMATION DIRECTLY FROM A SURFACE OF A PATTERNING DEVICE

FIELD

The present disclosure relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

As higher throughputs (accelerations) are achieved, greater inertial forces are experienced by the reticle and reticle slip occurs. Therefore, reticle position is difficult to establish with sub-nanometer certainty by relying on the vacuum clamping. It is desirable to have a system that provides for reticle position and curvature measurements having sub-nanometer resolution.

According to an aspect of the invention, in one embodiment, a lithographic apparatus that uses a patterning device to expose a substrate comprises a position determining system that is operative to determine a relative position of the patterning device with respect to a predetermined reference frame. The patterning device may be configured for creating a patterned radiation beam from a radiation beam incident on a major surface of the patterning device. The patterning device may have a side surface having an edge in common with the major surface. The position determining system may include an interferometer that is operative to transmit light to the side surface and to receive the transmitted light after the transmitted light has been reflected at the side surface such that the position determining system being operative to determine a quantity representative of the relative position of the patterning device from the received reflected transmitted light.

In a further embodiment, a lithographic apparatus comprises an illumination system configured to condition a radiation beam and a support constructed to support a patterning device. The patterning device is being configured to impart the radiation beam with a pattern in its cross-section to form a patterned radiation beam. The lithographic apparatus further comprises a substrate table constructed to hold a substrate and a projection system configured to project the patterned radiation beam onto a target portion of the substrate. The lithographic apparatus further comprises a position determining system operative to determine a relative position of the patterning device with respect to a predetermined reference frame. The patterning device is configured for creating the patterned radiation beam from the radiation beam incident on a major surface of the patterning device. The patterning device has a side surface having an edge in common with the major surface. The position determining system includes an interferometer that is operative to transmit light to the side surface and to receive the transmitted light after the transmitted light has been reflected at the side surface such that the position determining system being operative to determine a quantity representative of the relative position of the patterning device from the received reflected transmitted light.

In a further embodiment, a device manufacturing method comprises imparting a radiation beam with a pattern in its cross-section to form a patterned radiation beam by using a patterning device. The method further includes determining a relative position of the patterning device with respect to a predetermined reference frame using a position determining system. The patterning device may be configured for creating a patterned radiation beam from a radiation beam incident on a major surface of the patterning device. The patterning device has a side surface having an edge in common with the major surface. The position determining system includes an interferometer that is operative to transmit light to the side surface and to receive the transmitted light after the transmitted light has been reflected at the side surface such that the position determining system being operative to determine a quantity representative of the relative position of the patterning device from the received reflected transmitted light. The method further includes controlling at least one of a position and a curvature of the patterning device using a system that provides position and curvature control based on the received reflected transmitted light by the interferometer. Finally, the method includes projecting the patterned radiation beam onto a target portion of a substrate.

Further features and advantages as well as the structure and operation of various embodiments are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings which are incorporated herein and form a part of the specification, illustrate the present invention and together with the description, further serve to explain the principles of the invention and to enable a person skilled in the pertinent art(s) to make and use the invention.

Figure 1:
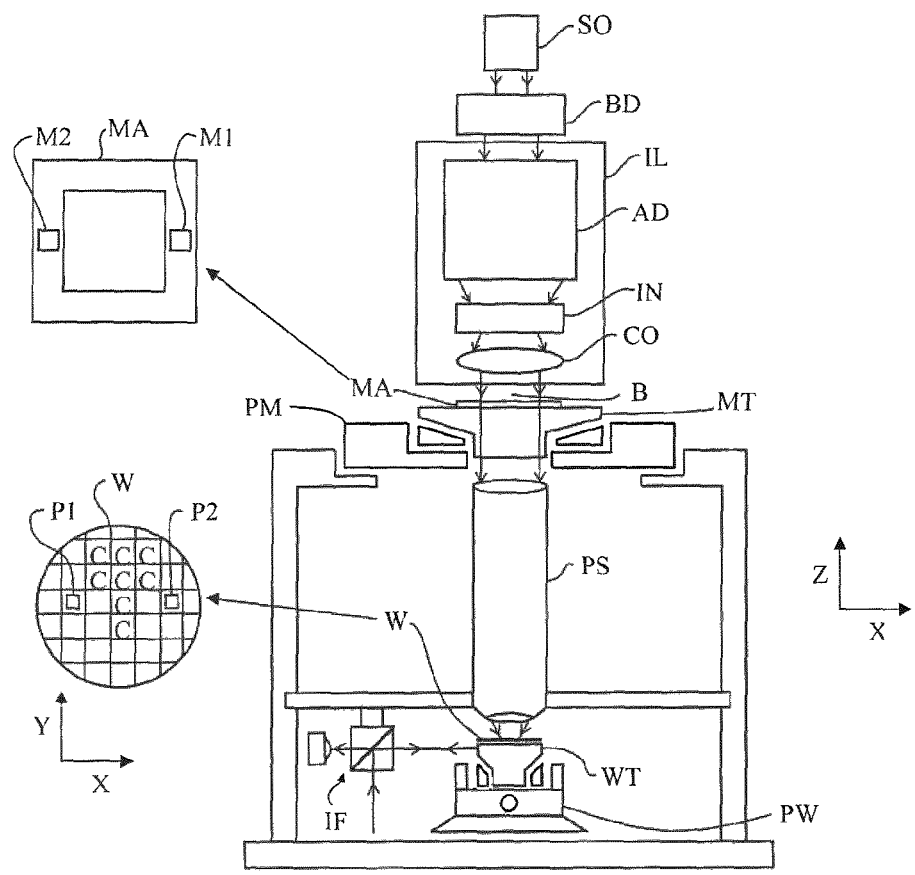
FIG. 1 depicts a lithographic apparatus according to an embodiment of the invention.

Embodiments are described below with reference to the accompanying drawings. In the drawings, generally, like reference numbers indicate identical or functionally similar elements. Additionally, the left most digit(s) of a reference number generally identifies the drawing in which the reference number first appears.

DETAILED DESCRIPTION

A lithographic apparatus and a method for manufacturing a device are disclosed, wherein the position and curvature of a patterning device can be obtained with sub-nanometer accuracy.

It is noted that references in this specification to "one embodiment," "an embodiment," "an example embodiment," etc., indicate that the embodiment described may include a particular feature, structure, or characteristic, but not every embodiment may necessarily include the particular feature, structure, or characteristic. Moreover, such phrases are not necessarily referring to the same embodiment. Further, when a particular feature, structure, or characteristic, is described in connection with an embodiment, it is submitted that it is within the knowledge of one skilled in the art to effect such feature, structure, or characteristic in connection with other embodiments whether or not explicitly described. The following detailed description refers to the accompanying drawings that illustrate the example embodiments. The detailed description is not meant to be limiting. Rather, the scope of embodiments is defined by the appended claims.

FIG. 1 schematically depicts a lithographic apparatus according to one embodiment of the invention. The apparatus comprises:

an illumination system (illuminator) IL configured to condition a radiation beam;

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multi-stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
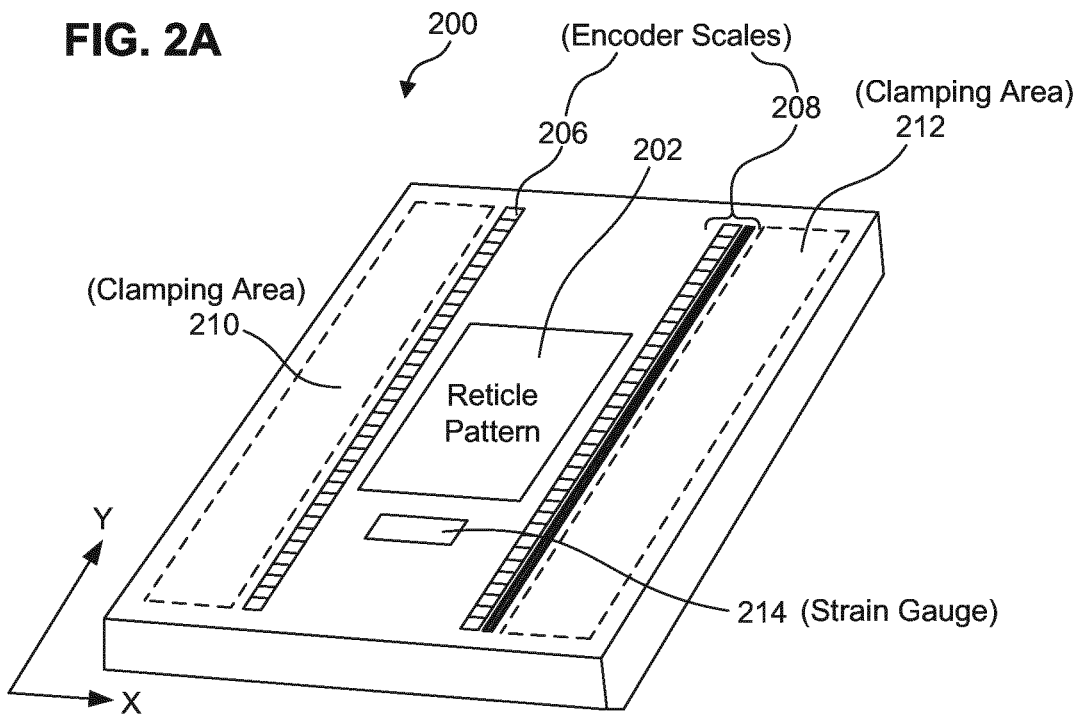
FIGS. 2A, 2B, 2C, 3A, and 3B illustrate embodiment patterning devices having encoder scales and/or reflective edges for position measurement.
Figure 2B:
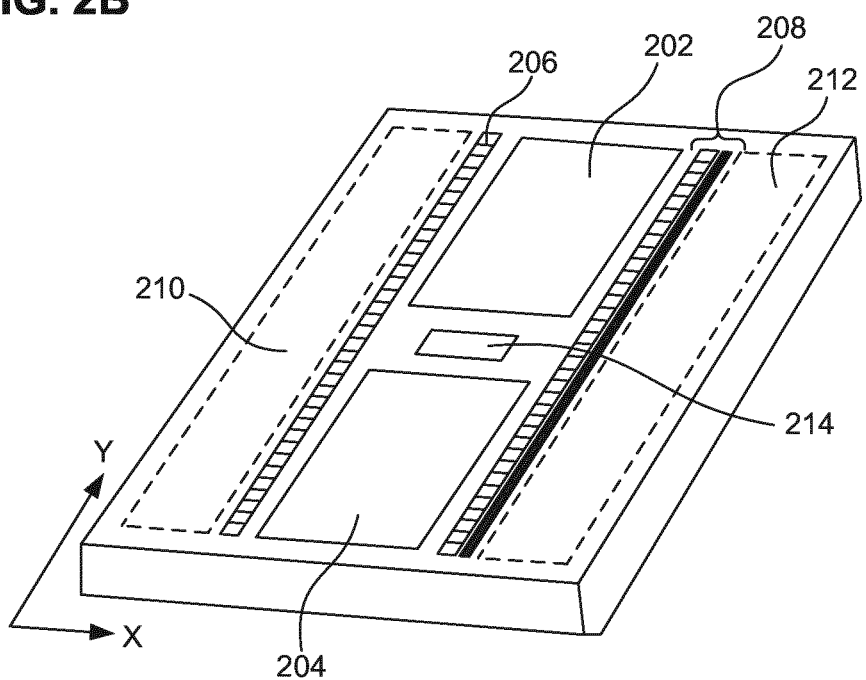

FIGS. 2A and 2B illustrate new substrate (such as a reticle) formats optimized for the requirements of sub-nanometer positioning and bending in accordance with one embodiment of the present invention.

According to one embodiment, a 12×12 inch reticle 200 format is disclosed but the present invention is not limited to such a format. This format accommodates up to two reticle patterns centered on the glass. FIG. 2A illustrates an embodiment with one reticle pattern 202 and FIG. 2B illustrated an embodiment with two reticle patterns 202 and 204. Such a device is said to have a 12 inch×12 inch form factor.

Encoder scales 206 and 208 can be etched on the reticle 200 at each side of the pattern 202 in FIG. 2A, and at each side of the patterns 202 and 204 in FIG. 2B. These encoder scales can be read by sensors mounted on top of the lens and comprise the primary means of short-stroke (SS) position feedback. Encoder scales on the chuck are not needed during reticle exposure because the 12 inch long reticle scales are sufficiently long to accommodate scan and turn-arounds. Redundant encoder heads in the lens top make this geometrically possible (e.g., a dedicated or overlapping set of encoder heads for each of the two patterns).

In an alternative embodiment, in place of encoder scales 206 and 208, reticle 200 includes polished edges 220, 222 with a reflective coating to provide scanning reticle position feedback. The reflective coatings 220, 222 are used by one or more interferometers 224a, 224b, 224c to directly measure the position of the reticle using interferometer beams 226a, 226b, 226c. In a further embodiment, as an alternative to reflective coatings, a reflector(s) can be attached on edges 220, 222 to reticle 200 using adhesive or optical contacting. Similar to the reflective coatings, the reflector(s) is used by one or more interferometers 224a, 224b, 224c to directly measure the position of the reticle to sub-nanometer resolution.

The one or more interferometers 224a, 224b, 224c may measure the distance from the polished edges 220, 222 with the reflective coating of the reticle. The one or more interferometers 224a, 224b, 224c may be located at a frame of a lithographic apparatus or a support that supports the patterning device in the lithographic apparatus. A patterning device for use in a lithographic apparatus, such as the reticle 200 may comprise at least one patterning area configured to impart a radiation beam with a pattern in its cross-section to form a patterned radiation beam. The reticle may further comprise a first major surface (e.g., top of the reticle 200) and a second major surface (e.g., bottom of the reticle 200) substantially parallel to the first major surface wherein a distance between the first and second major surfaces defines a volume with a vertical edge. The vertical edge may include the polished edges 220, 222 with a reflective coating to provide. The reflective coatings 220, 222 may be configured to be read by the one or more interferometers 224a, 224b, 224c. The one or more interferometers 224a, 224b, 224c may be configured to use the one or more reflecting surfaces of the reflective coatings 220, 222 to provide position information of the reticle 200 relative to the frame or the support.

The additional areas 210 and 212 on the sides of the reticle 200 also accommodate wider clamping areas for improved vacuum clamping.

In an embodiment, a strain gauge 214 can be etched on the reticle 200 to measure strain in at least one direction. FIG. 2A illustrates the strain gauge 214 next to the pattern area 202 that is configured to measure strain in the X direction of the reticle 200. FIG. 2B illustrates a strain gauge 214 located between the two reticle patterns 202 and 204 configured to measure strain in the X direction of the reticle 200. In other embodiments, strain gauges can be included to measure strain along other directions (e.g., along the Y direction).

In the embodiments of FIGS. 2A and 2B, an encoder based on the encoder scale 206 is illustrated as one configured to measure Y position while an encoder based on the encoder scale 208 (e.g., illustrated as a 2D encoder) is configured to measure both X and Y position. In further embodiments other arrangements of encoders are possible. For the embodiments that use reflective coatings or reflectors on the edges 220, 222 of reticle 200, interferometers 224a, 224b, 224c are used to measure both X and Y position of reticle 200 to sub-nanometer resolution.

In further embodiments, electrical contacts in the reticle clamp and circuitry on board the chuck (e.g., mask table MT) may also be provided to enable direct reading of the strain at the level of the chrome layer of the reticle 200 to detect bending, thus providing feedback for closing the bender's servo loop.

Figure 2C:
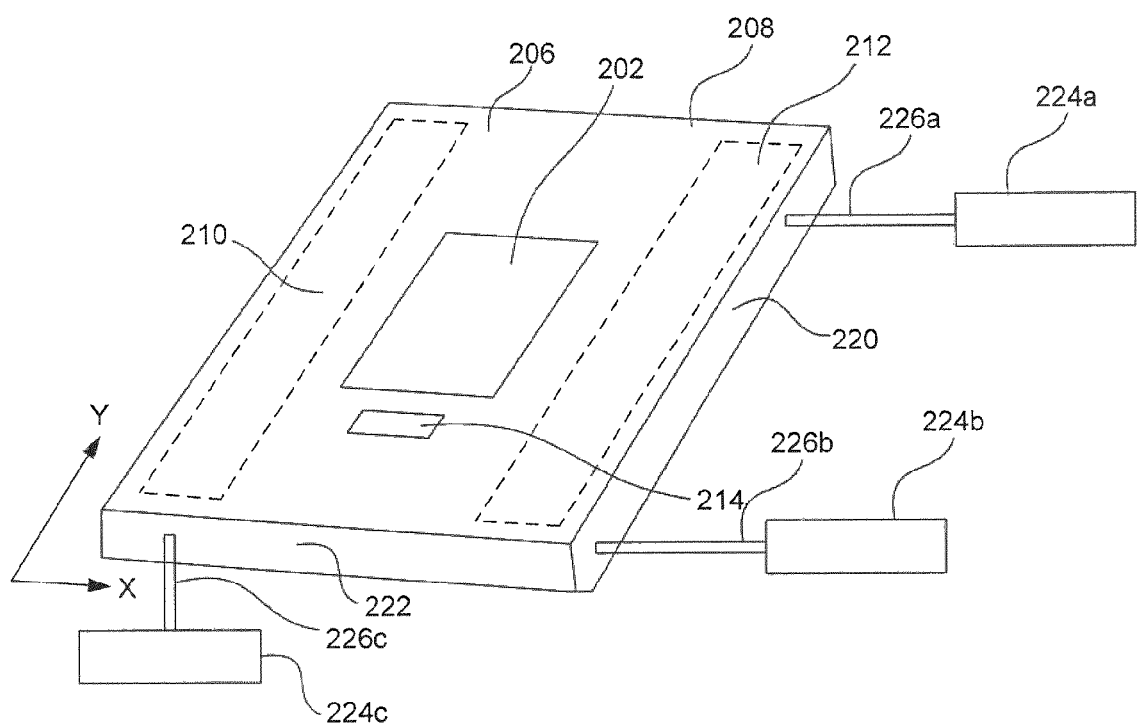
Figure 3A:
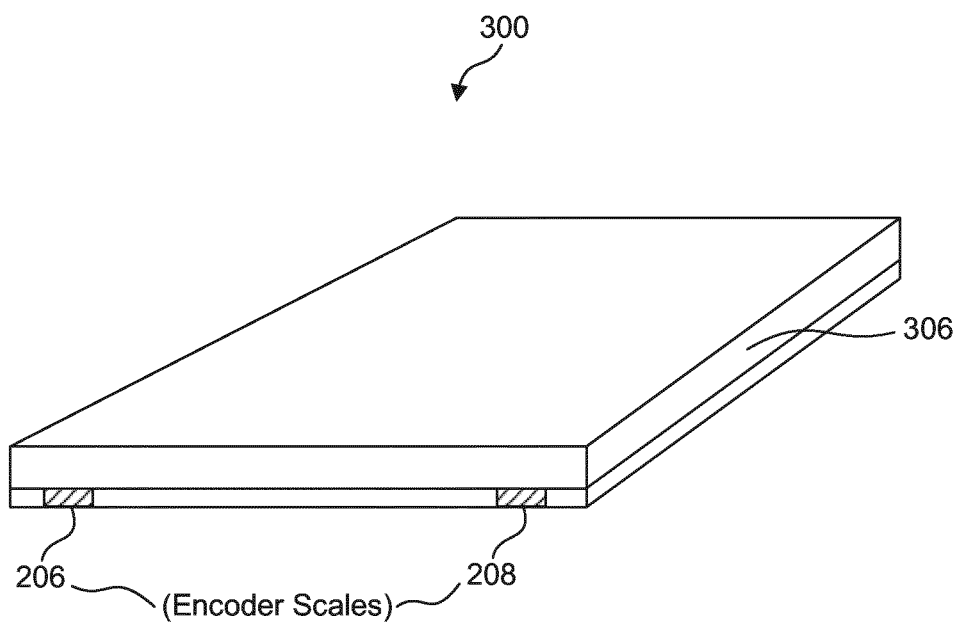

FIG. 3A is a perspective view of a reticle 300 according to embodiments of FIGS. 2A and 2B showing the encoder scales 206 and 208 relative to a reticle substrate 306. In an alternative embodiment, in place of encoder scales 206 and 208, reticle 300 includes polished edges (similar to 220, 222 illustrated in FIG. 2C) with a reflective coating, or a reflector attached using adhesive or optical contacting, to provide scanning reticle position feedback to sub-nanometer resolution for use by an interferometer.

Figure 3B:
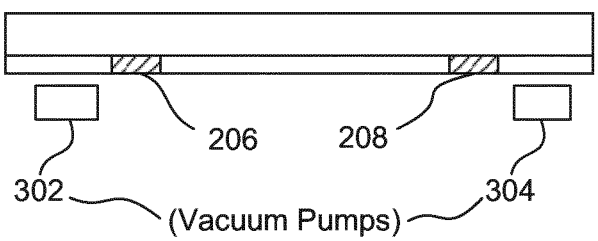

FIG. 3B illustrates a configuration of the reticle 300 according to embodiments of FIGS. 2A and 2B with respect to vacuum clamps 302 and 304 on the chuck.

Figure 4:
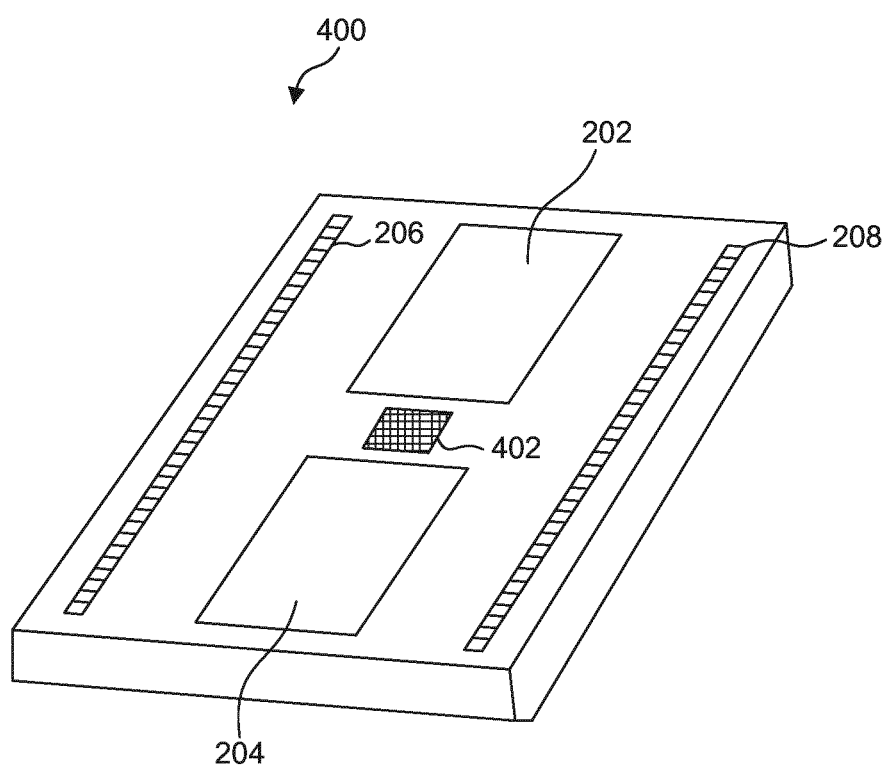
FIGS. 4, 5A-5C, and 6A-6C illustrate embodiment patterning devices having gratings for curvature measurement.
Figure 5A:
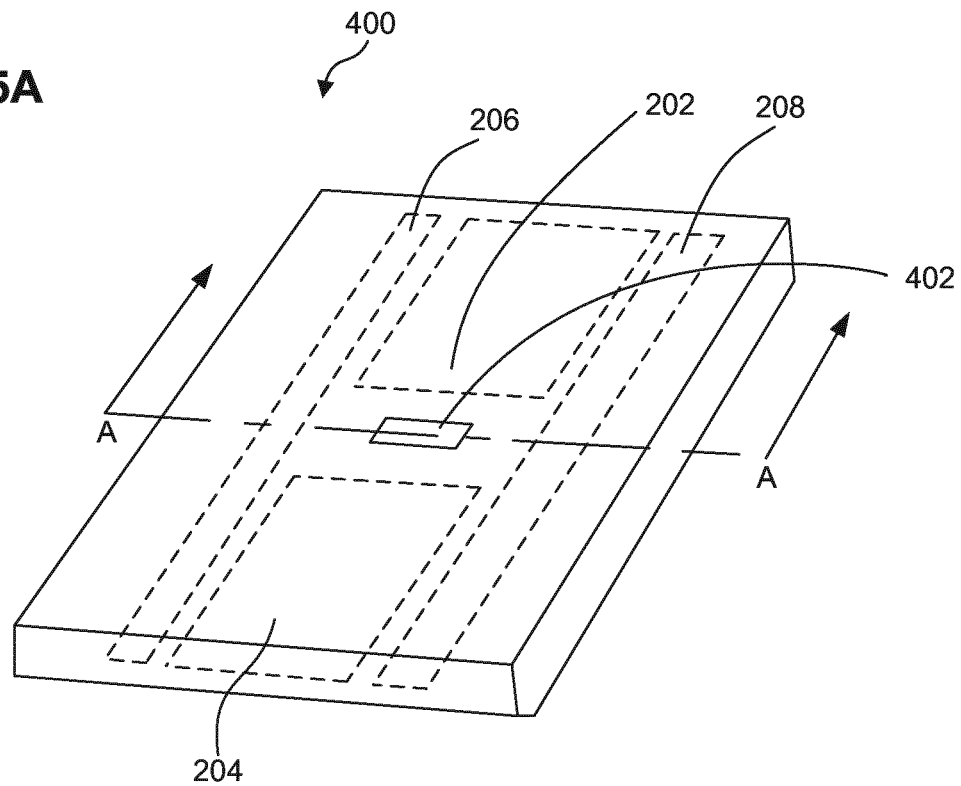
Figure 5A:
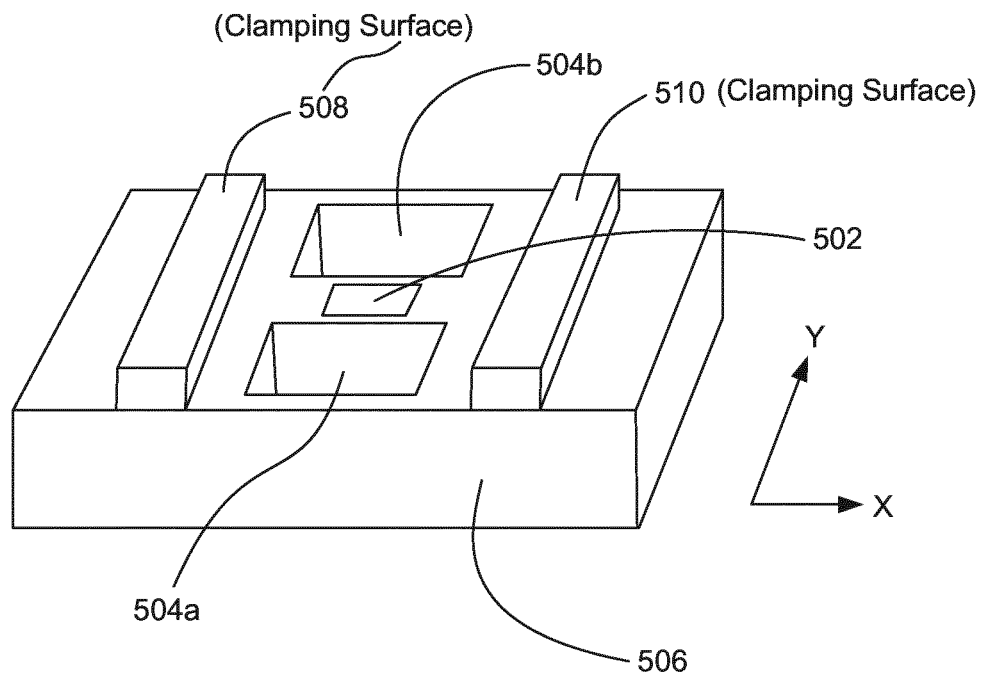

FIG. 4 illustrates a further embodiment, in which a grating 402 is etched in an area between pattern areas 202 and 204 of a reticle 400. This grating 402 is configured to interact with a corresponding second grating 502 coupled to a chuck 506 as illustrated in FIG. 5A. As the reticle bends, a Moire pattern is formed between the two gratings 402 and 502 and is detected via an optical sensor on the chuck or, in or on the lens for feedback.

FIG. 5A illustrates the reticle 400 of FIG. 4 positioned over the chuck 506. In this example, the reticle 400 is positioned so that pattern areas 202 and 204 and grating 402 are facing downward toward chuck 506. Chuck 506 is configured with clamping surfaces 508 and 510. Clamping surfaces 508 and 510 make contact with the reticle 400 in areas such as 210 and 212 of FIG. 2B defined as the region between encoders 206 and 208 and corresponding edges of the reticle 400 as is discussed below with respect to FIGS. 5B and 5C.

Chuck 506 is also configured with cutouts 504a and 504b to allow radiation passing through pattern areas 202 and 204 to pass through chuck 506.

Figure 5B:
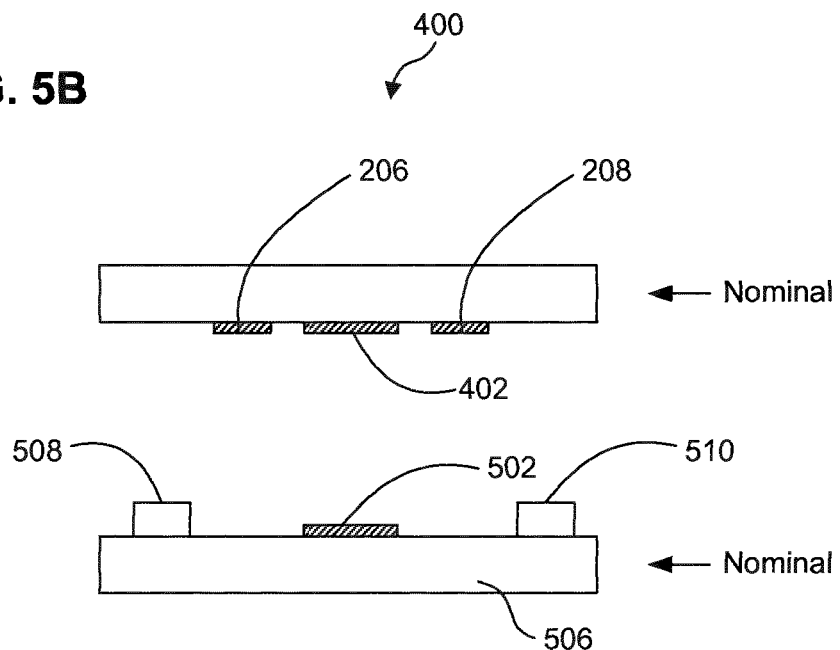

FIG. 5B illustrates a side view of the reticle 400 having the encoder scales 206 and 208 and the grating 402 in a nominally flat configuration relative to the chuck 506 of FIG. 5A having the grating 502 and clamping surfaces 508 and 510, also in a nominally flat configuration. In an alternative embodiment, in place of encoder scales 206 and 208, reticle 400 includes polished edges (similar to 220, 222 illustrated in FIG. 2C) with a reflective coating, or a reflector attached using adhesive or optical contacting, to provide scanning reticle position feedback to sub-nanometer resolution for use by an interferometer.

Figure 5C:
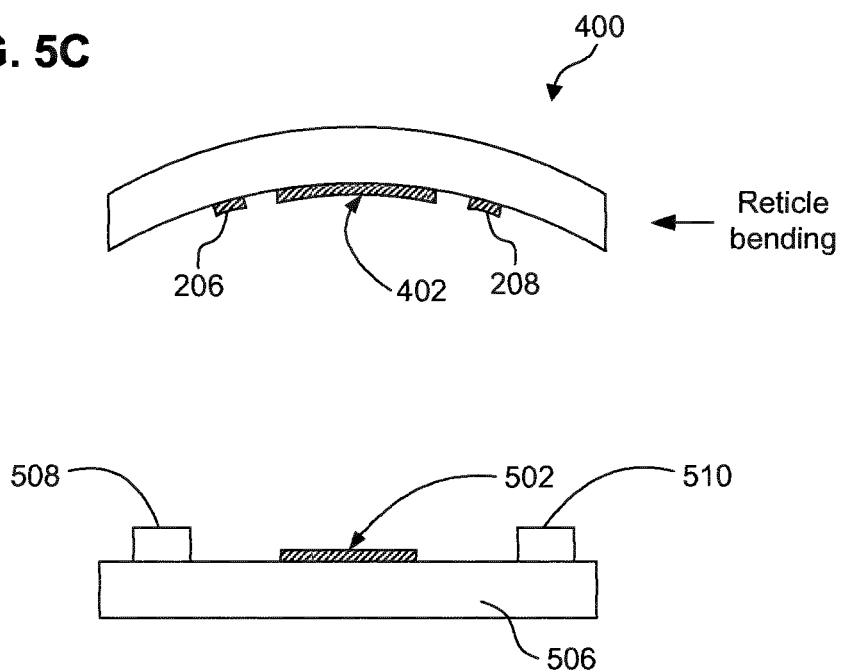

FIG. 5C illustrates a side view of the reticle 400 having the encoder scales 206 and 208 and the grating 402 in a bent configuration relative to the chuck 506 having the grating 502 and clamping surfaces 508 and 510. In this example, the reticle 400 is bent while the chuck 506 maintains a nominally flat configuration. Light passing through gratings 402 and 502 generates an optical Moire pattern that can be used to detect bending of the reticle. In an alternative embodiment, in place of encoder scales 206 and 208, reticle 400 includes polished edges (similar to 220, 222 illustrated in FIG. 2C) with a reflective coating, or a reflector attached using adhesive or optical contacting, to provide scanning reticle position feedback to sub-nanometer resolution for use by an interferometer.

Figure 6A:
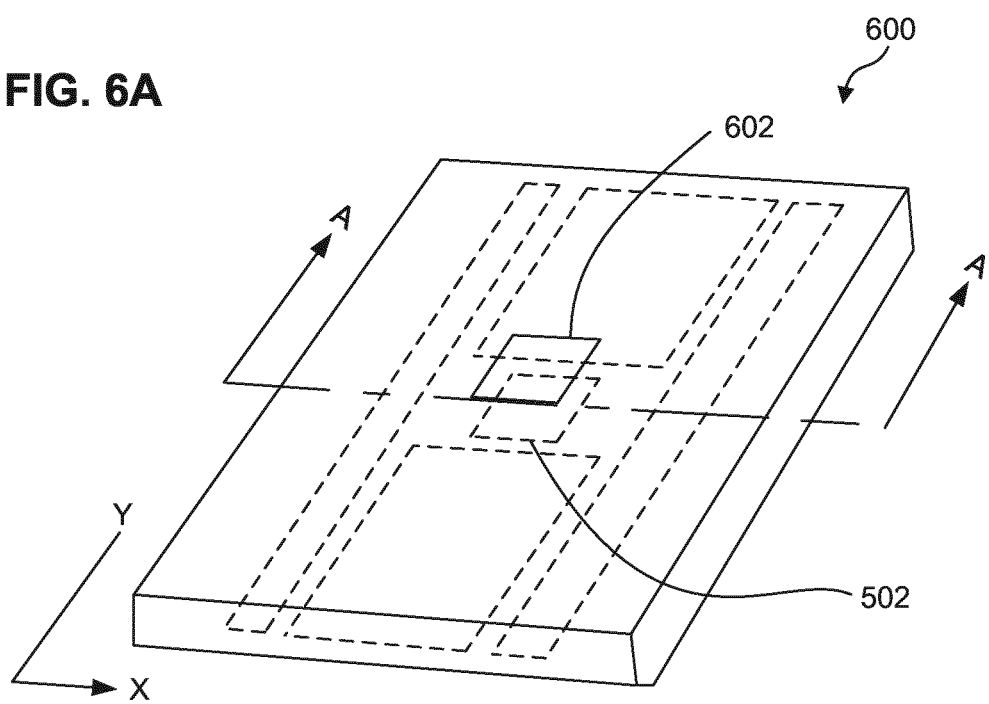
Figure 6B:
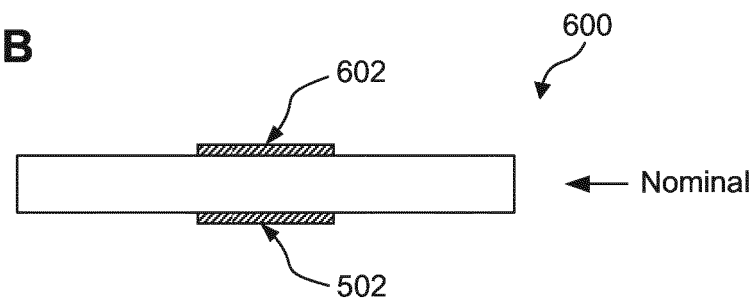
Figure 6C:
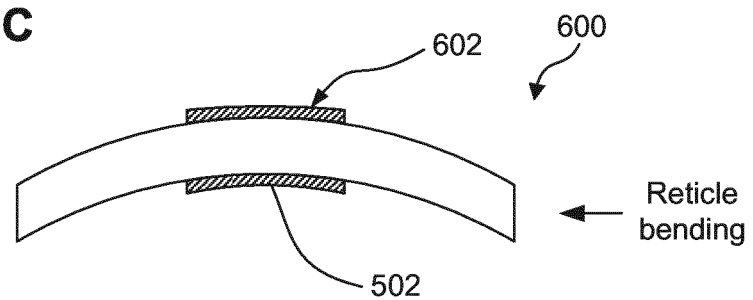

A further embodiment is illustrated in FIGS. 6A, 6B and 6C. In this embodiment, a second grating 602 is etched on the top side of a reticle 600. A Moire pattern then occurs between the first grating 502 on the bottom and the second grating 602 on the top and can be detected to determine bending as described in previously discussed embodiments.

FIG. 6B illustrates a side view of the reticle 600 of FIG. 6A in an unbent configuration. Gratings 502 and 602 are illustrated as well. FIG. 6C illustrates a side view of the reticle 600 of FIG. 6A in a bent configuration. Gratings 502 and 602 bend along with a substrate layer of the reticle 600. The geometric change between the bent configuration (FIG. 6C) and the unbent configuration (FIG. 6B) generates a Moire pattern that changes depending on the degree to which the reticle 600 is bent. Thus, by observing the changes in the Moire pattern the degree of bending can be determined as discussed above.

Figure 7:
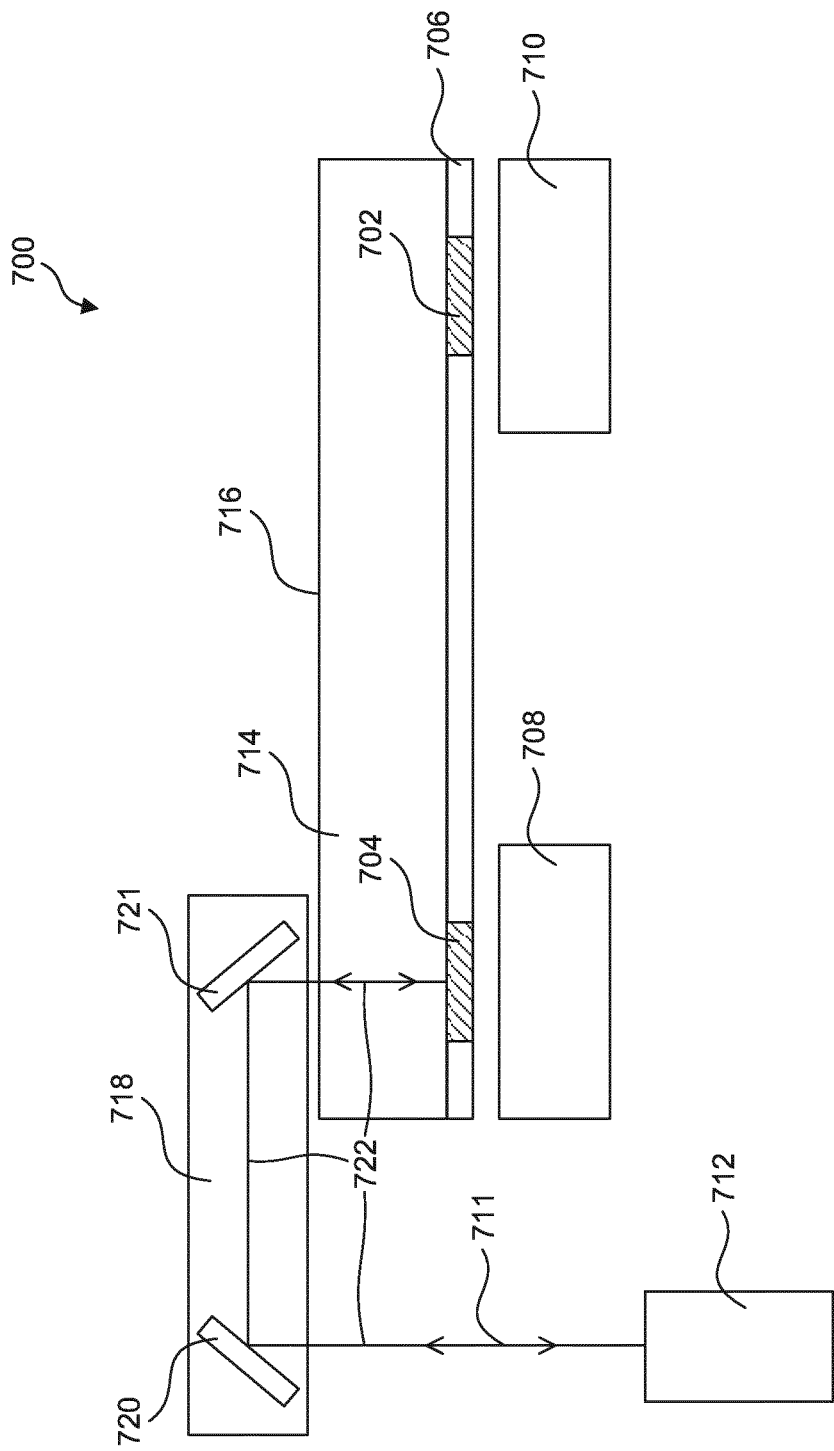
FIG. 7 illustrates an embodiment system having an upward-facing, "through the glass" encoder for position and curvature measurement.

Further embodiments are illustrated in FIG. 7. This figure depicts upward-facing, "through the glass" encoder scales 702 and 704 printed on a reticle 700, and systems configured for directing light from encoder heads to the scales and back.

Encoder scales 702 and 704 are printed on the chrome layer 706 of the reticle, in areas directly above the reticle clamping areas above the reticle clamps 708 and 710. Light 711 emanating from at least one encoder head 712 is directed through a glass substrate 714 of the reticle 700 in a direction substantially perpendicular to the large face 716 of the reticle 700 to the encoder scale 704 from where it is reflected through the glass substrate 714 of the reticle 700 back to the encoder head 712. In further embodiments two Y encoder scales and one X encoder scale are printed, enabling X, Y and Rz reticle position feedback, as known in the art. Embodiments of X encoder scales 206 and of XY encoder scales 208 were illustrated in FIGS. 2A and 2B above. In an alternative embodiment, in place of encoder scales 206 and 208, reticle 700 includes polished edges (similar to 220, 222 illustrated in FIG. 2C) with a reflective coating, or a reflector attached using adhesive or optical contacting, to provide scanning reticle position feedback to sub-nanometer resolution for use by an interferometer.

In other embodiments, an encoder head can be coupled to the top side of the projection optics lens. In this example, the light is directed from the encoder head 712 to the reticle 700 and back through a periscope 718. The X encoder scale can be printed adjacent to one of the Y scales, as known in the art (e.g., feature 208 in FIGS. 206 and 208). In such embodiments, two periscopes, a first one for a first Y scale and a second one for a second Y scale and the X scale can be use used. For convenience of illustration, only one periscope 718 is shown in FIG. 7.

In one embodiment, the periscope 718 contains two 45 degree first and second mirrors, 720 and 721, and is coupled to the chuck so that it extends over the top 716 of the reticle 700, enabling the encoder scale(s) to be viewed from below the reticle 700. The mirrors bend the optical path to form an inverted "U" 722. Light emanating from the encoder head 712 starts vertically and reflects off the first mirror 720 then continues horizontally above the reticle and reflects off the second mirror 721 then continues vertically and reflects off the encoder scale 704. The reflected encoded light then traces the same path 722 backwards towards the encoder head 712.

Figure 8:
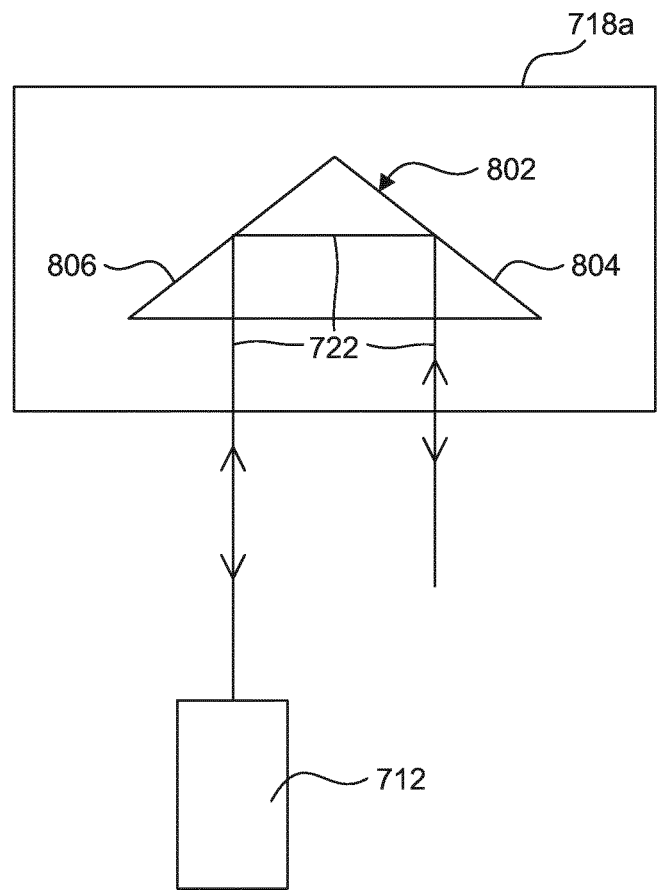
FIG. 8 illustrates a further embodiment system having an upward-facing, "through the glass" encoder including a prism.

In one embodiment, as illustrated in FIG. 8, a periscope 718a includes a prism 802, with two opposing faces 804 and 806 being oriented at approximately +/−45 degrees and reflectively plated, as is known in the art.

In one embodiment, a periscope is retractable in order to enable loading the reticle 700 onto the chuck from above.

In a further embodiments, a periscope can be coupled to the top of the lens and extend through an opening in the chuck. In other embodiments, a periscope can be coupled to an illuminator of the lithography tool. Similarly, a periscope can be coupled to other parts of the lithography system (e.g., the moving frame of the chuck, or in the fixed frame of the lens and the illuminator) as will be apparent to those of ordinary skill in the art.

Figure 9:
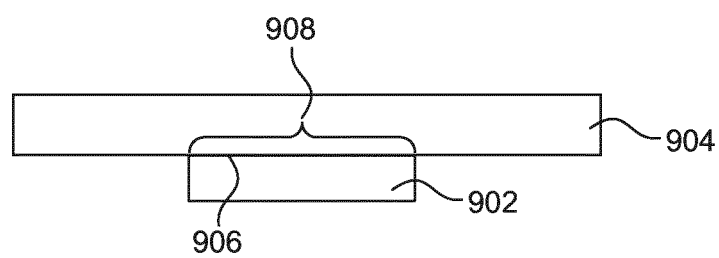
FIGS. 9-13 illustrate various embodiments including a reticle support plate that is larger than the reticle, is transparent to actinic light, and has encoder scales for position measurement during scanning.

In further embodiments, a reticle support plate larger than the reticle and transparent to actinic light is disclosed. Such a support plate can be provided with encoder scales for position feedback during scanning. An example of such a support plate is illustrated in FIG. 9. In this example, a reticle 902 is intimately coupled to a support plate 904 by the entirety of one of its large surfaces 906. Because an area 908 of the coupling is greatly increased compared to the present art, and because the coupling forces are uniformly distributed, there is no measurable reticle slip at the nanometer level in the presence of accelerations up to 20 G.

In certain embodiments, the encoder scales are printed on the support plate, while in others, individual encoder scales can be connected to the support plate such as by bonding or the like.

Figure 10:
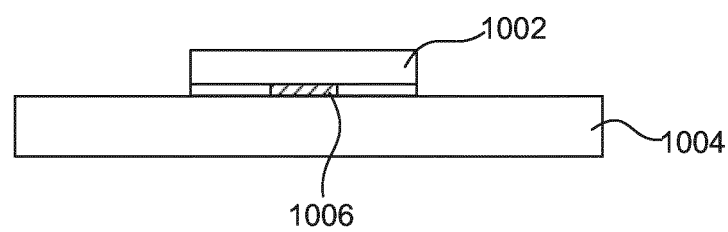

In one embodiment, illustrated in FIG. 10, a reticle 1002 is bonded onto a support plate 1004 with the pattern layer 1006 in contact with the support plate 1004. The transparent support plate defocuses particles similarly to the way a pellicle functions (which is advantageous since a pellicle may not be compatible with this embodiment).

Figure 11:
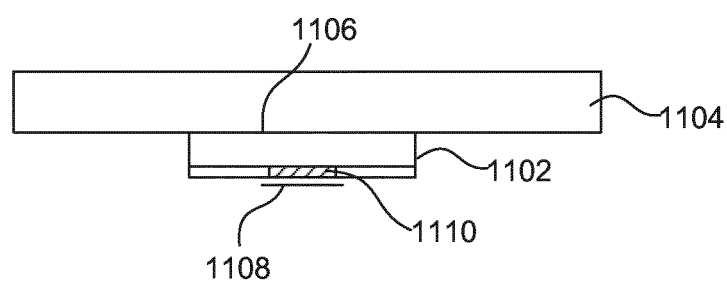

In a further embodiment, as illustrated in FIG. 11, a reticle 1102 is bonded onto a support plate 1104 with its unpatterned glass side 1106 in contact with the support plate. A pellicle 1108 is used to protect a patterned side 1110 as known in the art.

Figure 12:
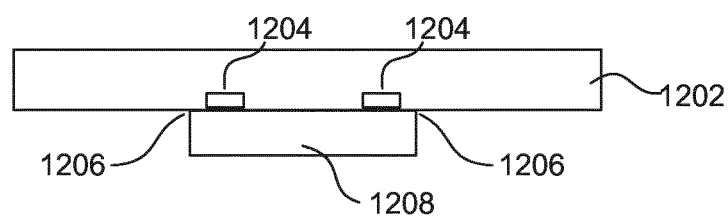

In a further embodiment, as illustrated in FIG. 12, a support plate 1202 has one or more vacuum grooves 1204 slightly inboard of a reticle glass perimeter 1206. Vacuum is used to clamp a reticle 1208 to the support plate 1202 by the entirety of its unpatterned glass surface. Optionally, the support plate 1202 can be permanently coupled to a reticle stage (RS) chuck 1202.

Figure 13:
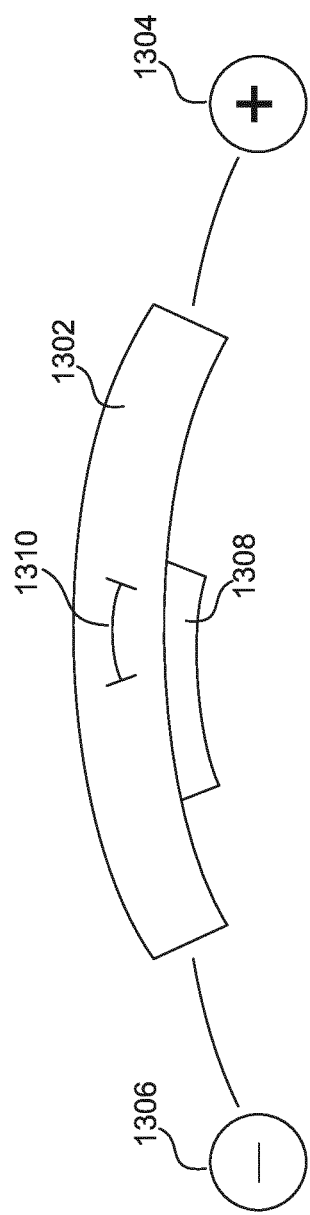

FIG. 13 illustrates an embodiment in which a support plate 1302 is made from a piezoelectric material and has at least two electrodes 1304 and 1306 at opposite ends. A be desirable for fine focus correction purposes (reticle bending).

In a further embodiment, at least one strain gauge 1310 can be printed on the support plate 1302 and connected via electrodes to the chuck. The strain gauge output can be used to measure curvature of the assembly. In other embodiments, curvature sensors can be coupled to the support plate 1302 as known in the art.

In the above embodiments, the bonding method is chosen among: electrostatic bonding, optical bonding, anodic bonding, brazing, gluing, or any other method known in the art. If the chosen bonding method is not transparent to actinic light, the reticle patterned area can be excluded from the bonding region.

Figure 14A:
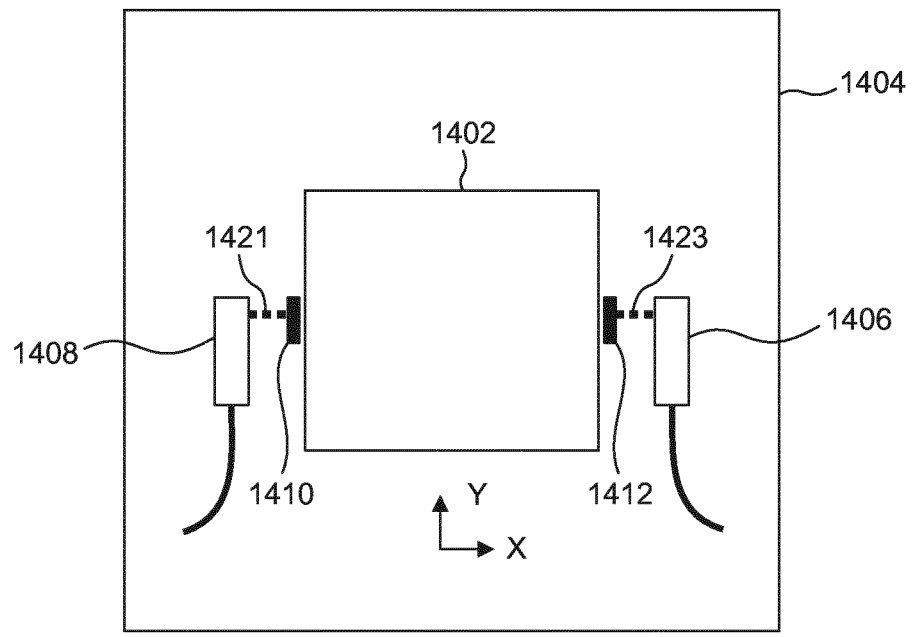
FIGS. 14A and 14B illustrate an embodiment of a patterning device having encoder scales on opposing sides of the patterning device.
Figure 14B:
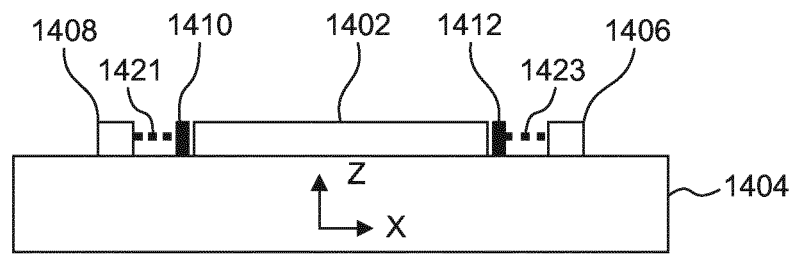

FIGS. 14A and 14B illustrate new patterning device (such as a reticle) formats optimized for determining a position of the reticle relative to the chuck in accordance with one embodiment of the present invention. In FIGS. 14A and 14B, a reticle 1402 is located on a support surface, such as a chuck 1404, for use in imparting a pattern on a substrate. Encoder heads 1406 and 1408 are placed at opposing sides of the reticle 1402. In FIG. 14A, the encoder heads 1406 and 1408 are located on either side of the reticle 1402 along the indicated Y-axis. Alternatively, the encoder heads could be placed on either side of the reticle 1402 along the X-axis to same effect.

In the embodiment shown in FIGS. 14A and 14B, encoder heads 1406 and 1408 are two-dimensional (2D) encoder heads that can measure motion of the reticle 1402 along the X- and Y-axis. The 2D encoder heads have a precision of approximately 1/10 nm, such as the 2D encoder head manufactured by Heidenhain Corporation. However, any other encoder head is suitable if it has the noted level of precision. The encoder heads 1406 and 1408 perform their measurements by interacting with encoder scales 1410 and 1412.

Encoder scales 1410 and 1412 are flexure mounted, for example, to the chuck 1404 on the same sides as where the encoder heads 1406 and 1408 are located. There is sufficient space between the encoder scales 1410 and 1412 and the reticle 1402, such that the reticle 1402 may be loaded and unloaded without damage to either the reticle 1402 by the encoder scales 1410 and 1412 or the encoder scales 1410 and 1412 by the reticle 1402. This space may be in the range of a few millimeters, for example.

As an alternative to the other embodiments shown above, in one embodiment, the encoder scales 1410 and 1412 are attached to the vertical sides of the reticle 1402 by use of vacuum force after the reticle 1402 has been loaded. The vertical sides of the reticle 1402 are perpendicular to the surface of the chuck 1404 on which the reticle 1402 rests, as can be seen in the side view of FIG. 14B, such that the encoder heads 1406 and 1408 read the encoder scales 1410 and 1412 on these vertical sides, instead on the top or bottom, of the reticle 1402. The vacuum force may be provided to the encoder scales 1410 and 1412 via vacuum tubes, not shown, through the chuck 1404. The vacuum force is strong enough to overcome the resistance by the flexure mount and cause the encoder scales 1410 and 1412 to attach securely to the sides of the reticle 1402. When the reticle 1402 is ready for removal, the vacuum force is stopped and the encoder scales 1410 and 1412 spring back to their original positions a few millimeters away from the reticle 1402 due to the spring force in the flexure mounts.

In alternative embodiments, the encoder scales 1410 and 1412 may be attached to the vertical sides of the reticle 1402 in other ways. For example, the encoder scales 1410 and 1412 may be attached to the vertical sides of the reticle 1402 by use of electromagnetic force after the reticle 1402 has been loaded. As an alternative, the encoder scales 1410 and 1412 may be configured to attach electrostatically to the vertical sides of the reticle 1402. As an additional example, the encoder scales 1410 and 1412 may instead be affixed with glue or other adhesive, printed onto, or etched into the vertical sides of the reticle 1402 that face the encoder heads 1406 and 1408.

In operation, the 2D encoder heads 1406 and 1408 measure motion of the encoder scales 1412 and 1410, respectively, along the X- and Y-axis. With this information, the position of the reticle 1402 relative to the chuck 1404 is directly measured. This provides Rz and expansion information of the reticle 1402 along the X-axis. If the encoder heads are arranged along the Y-axis, then the measurements provide Rz and expansion information of the reticle 1402 along the Y-axis. Directly measuring the position of the reticle 1402 enables the correction of potential overlay errors due to slip, drift, or thermal expansion of the reticle 1402.

With this information, a servo loop may be used to control the position of the reticle based on the feedback acquired from the direct measurement of the reticle 1402 relative to the chuck 1404. In one embodiment, the servo loop operates to control the position of the reticle by adjusting the position of the chuck 1404 using the first positioner PM. This servo loop operates in addition to the existing positional feedback mechanisms otherwise controlling the position of the chuck 1404. Additionally or alternatively, in one embodiment the position of the reticle 1402 may be controlled independently of the chuck 1404 using a short-stroke module associated with the chuck 1404 specifically designed to interact with the reticle 1402 based on the servo loop.

Figure 15A:
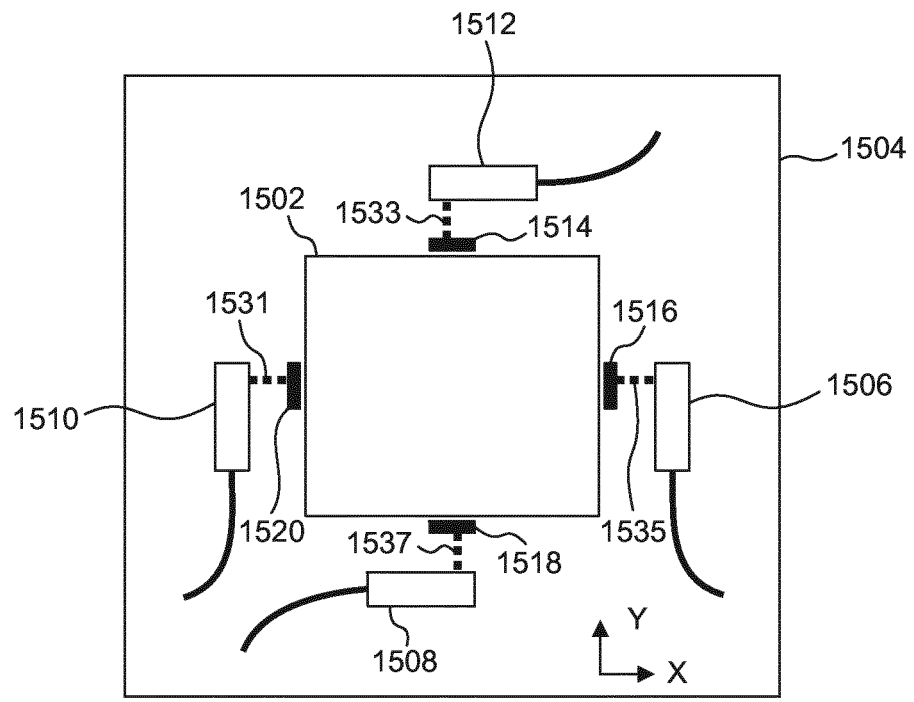
FIGS. 15A and 15B illustrate an alternative embodiment of a patterning device having encoder scales on all four sides of the patterning device for detecting patterning device expansion in two directions.
Figure 15B:
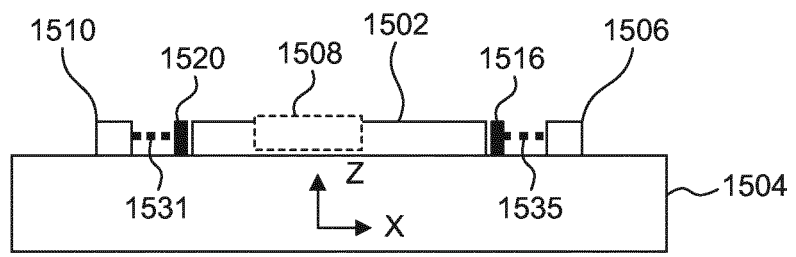

FIGS. 15A and 15B illustrate an alternative embodiment with encoder scales on all four sides of the patterning device for detecting patterning device expansion in two directions. The embodiment illustrated in FIGS. 15A and 15B shares many substantially similar features as the embodiment illustrated in FIGS. 14A and 14B, and therefore only differences between them will be described in further detail.

In FIGS. 15A and 15B, four encoder heads 1506, 1508, 1510, and 1512 may be used instead of the two shown in FIGS. 14A and 14B. In one embodiment, the four encoder heads 1506, 1508, 1510, and 1512 may be one-dimensional (1D) encoder heads. In this configuration, the encoder heads 1506, 1508, 1510, and 1512 are capable of measuring the X, Y, and Rz position information of the reticle 1502 but are not able to detect thermal expansion of the reticle 1502. Corresponding encoder scales 1514, 1516, 1518, and 1520 are configured to enable measurement in the one dimension by the encoder heads 1506, 1508, 1510, and 1512.

Alternatively, similar to the encoder heads of FIGS. 14A and 14B, the encoder heads 1506, 1508, 1510, and 1512 may be 2D encoder heads capable of measurements in the X- and Y-directions. With the additional 2D encoder heads, it is possible to also detect reticle expansion along both the X- and Y-axis in situations where there is asymmetrical heating of the reticle 1502.

Figure 16A:
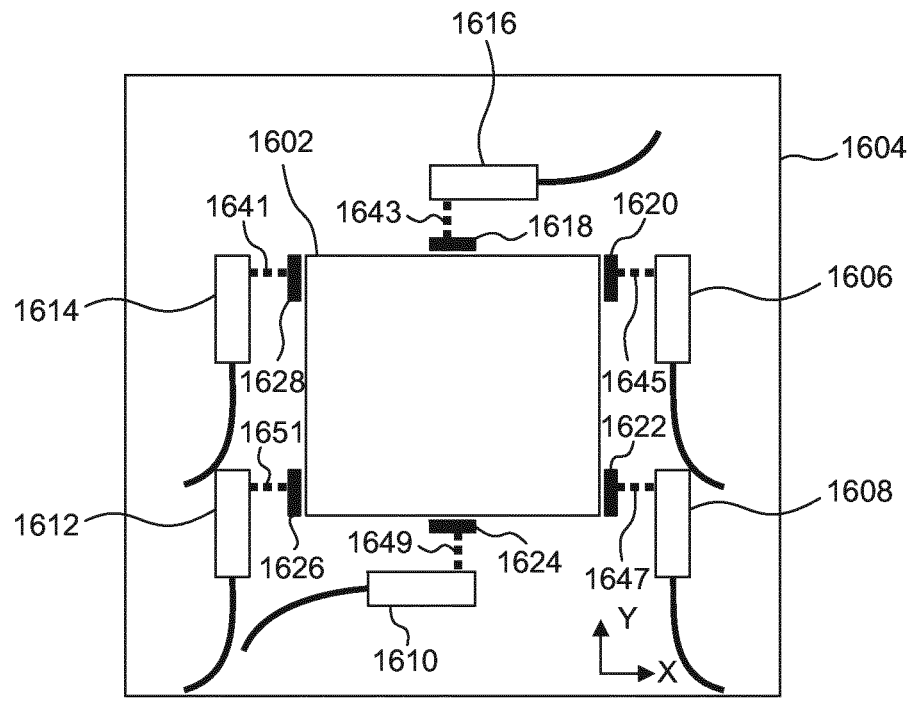
FIGS. 16A and 16B illustrate a further alternative embodiment of a patterning device having encoder scales corresponding to 1D encoder heads for detecting patterning device expansion in one direction.
Figure 16B:
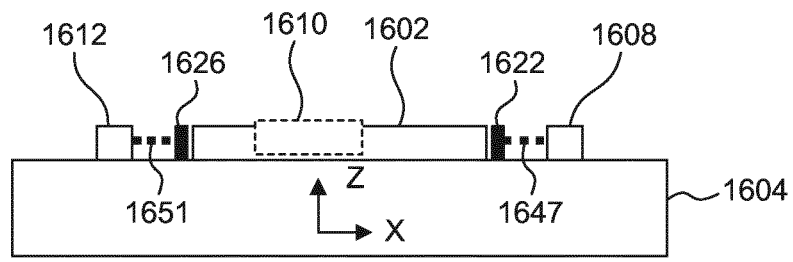

FIGS. 16A and 16B illustrate a further alternative embodiment with encoder scales corresponding to 1D encoder heads for detecting patterning device expansion in one direction. The embodiment illustrated in FIGS. 16A and 16B shares many substantially similar features as the embodiments illustrated in FIGS. 14A, 14B, 15A, and 15B, and therefore only differences between them will be described in further detail.

In FIGS. 16A and 16B, six 1D encoder heads 1606, 1608, 1610, 1612, 1614, and 1616 may be used instead of the two shown in FIGS. 14A and 14B or the four shown in FIG. 15A. In this configuration, the encoder heads 1606, 1608, 1610, 1612, 1614, and 1616 are capable of measuring the X, Y, and Rz position information of the reticle 1602 and thermal expansion in one direction. In the embodiment shown in FIGS. 16A and 16B, the encoder heads 1610 and 1616 are situated to measure the X-position of the reticle 1602 using corresponding encoder scales 1624 and 1618, respectively. The encoder heads 1606, 1608, 1612, and 1614 are situated to measure the Y-position of the reticle 1602 using corresponding encoder scales 1620, 1622, 1626, and 1628, respectively.

In this embodiment, the encoder heads 1606, 1608, 1612, and 1614 are additionally capable of detecting thermal expansion of the reticle 1602 along the Y-axis because two encoder heads are placed along the Y-axis on either side of the reticle 1602. The embodiment shown in FIGS. 16A and 16B could alternatively detect thermal expansion of the reticle 1602 along the X-axis by placing two encoder heads along the X-axis instead.

Figure 17A:
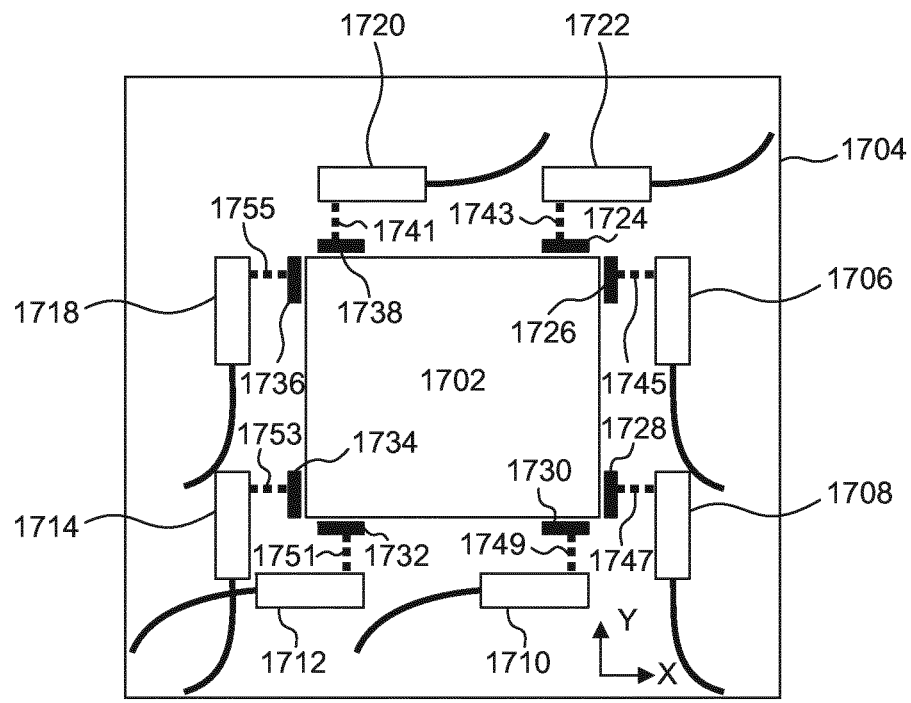
FIGS. 17A and 17B illustrate a further alternative embodiment of a patterning device having encoder scales corresponding to 1D encoder heads for detecting patterning device expansion in two directions.
Figure 17B:
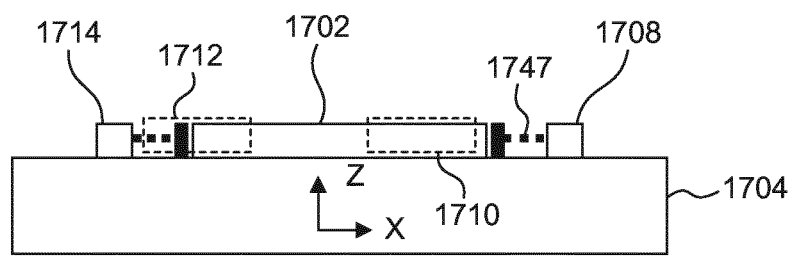

According to this alternative, FIGS. 17A and 17B illustrate a further alternative embodiment of a patterning device having encoder scales corresponding to 1D encoder heads for detecting patterning device expansion in two directions. The embodiment illustrated in FIGS. 17A and 17B shares many substantially similar features as the embodiments illustrated in FIGS. 16A, and 16B, and therefore only differences between them will be described in further detail.

As discussed above with respect to the embodiments depicted in FIGS. 16A and 16B, two encoder heads could be placed along the X-axis to detect thermal expansion of the reticle 1702 along the X-axis on each side of the reticle 1702, in addition to the two encoder heads placed along the Y-axis on each side of the reticle 1702 that detects thermal expansion along the Y-axis. This is shown in FIG. 17A as encoder heads 1710, 1712, 1720, and 1722 along the X-axis on either side of the reticle 1702, with corresponding encoder scales 1730, 1732, 1738, and 1724. Similar to the embodiment in FIG. 16A, encoder heads 1706, 1708, 1714, and 1718 are placed along the Y-axis on either side of the reticle 1702, with corresponding encoder scales 1726, 1728, 1734, and 1736.

Similar to FIG. 14A, in alternative embodiments the encoder scales for any of FIGS. 15A-17B may be attached to the vertical sides of the reticle in other ways besides vacuum force. For example, the encoder scales may be attached to the vertical sides of the reticle by use of electromagnetic force after the reticle has been loaded. As an alternative, the encoder scales may be configured to attach electrostatically to the vertical sides of the reticle. As an additional example, the encoder scales may instead be affixed with glue or other adhesive, printed onto, or etched into the appropriate vertical sides of the reticle.

In the embodiments discussed above with respect to FIGS. 14A-17B, attaching the encoder scales to the vertical sides of the reticle is advantageous because it allows more room for clamping the reticle to the chuck, which can aid in decreasing reticle slip. Further, the encoder scales have better dynamics than long encoder scales that would be necessary for reticle to lens top metrology and reticle position is measured throughout the entire scan, instead of scanning on and off of the encoder scale.

Figure 18:
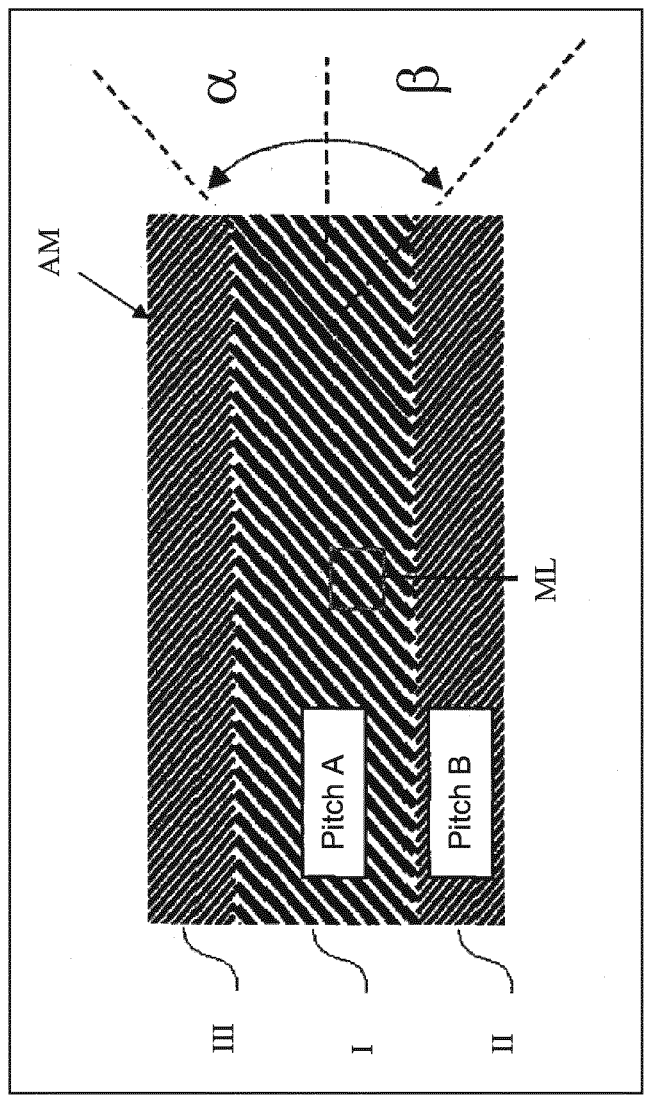
FIG. 18 illustrates an exemplary embodiment of an encoder scale's microstructure.

FIG. 18 illustrates an exemplary embodiment of an encoder scale's microstructure. This exemplary microstructure may be applied in any of the embodiments disclosed above that utilize an encoder scale, as will be recognized by one skilled in the art. Scanning of the encoder scale 1800 takes place along the length of the encoder scale. Encoder scale 1800 includes a periodic structure formed by mark lines ML. In one example, the encoder scale 1800 is formed on a reticle, such as reticle 200 from FIG. 2A. The encoder scale 1800 includes a first area I that has a first periodic structure formed by first mark lines ML extending in a first direction. The first direction is at a first angle $\alpha$ with respect to the long axis of the encoder scale (shown in FIG. 18 as the horizontal axis), such that $0°<\alpha<90°$.

The encoder scale 1800 also includes a second area II that has a second periodic structure formed by second mark lines ML extending in a second direction. The second direction is at a second angle $\beta$ with respect to the long axis of the encoder scale 1800, such that $-90°<\beta<0°$. The encoder scale 1800 further includes a third area III that has a third periodic structure. The third periodic structure is similar to the second periodic structure. The first periodic structure may have a first pitch A, and the second and third periodic structure may each have a second pitch B. Further, the first area may be adjacent to the second and third areas.

Encoder scale 1800 has an inversion symmetry (180 degrees rotation), which allows alignment with a sensor, such as a self-referencing alignment sensor. Alignment by another sensor (e.g., a diffraction alignment sensor or a Through The Lens Type (TTL) alignment sensor) would beneficially make use of a grating structure similar to the mark shape.

Figure 19:
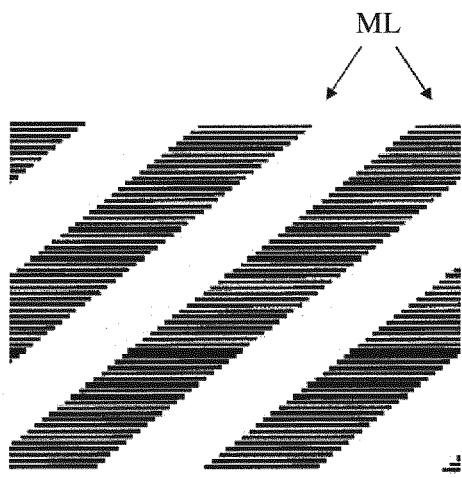
FIG. 19 illustrates an exemplary embodiment of an alignment structure of an encoder scale's microstructure.

FIG. 19 shows an example of how the alignment structure of encoder scale 1800 can be sub-segmented. FIG. 19 shows that the oblique mark lines ML can be formed by a number of sub-mark lines that are not oblique. Instead, the mark lines ML may be in the direction of the long axis of the encoder scale 1800, which allows easy formation. Other orientations or a polar design are also possible. At sub-wavelength segmentation, this structure acts as a normal alignment structure. It is relatively easily exposed (in contrast to solid oblique lines). According to an embodiment, the mark lines ML are formed by a plurality of sub-segment lines extending parallel or perpendicular with respect to the long axis of the encoder scale 1800. According to another embodiment, the mark lines are formed by a plurality of sub-segment lines in a polar design.

According to this embodiment, the first periodic structure has a first period and the second periodic structure has a second period, the first period differing from the second period. An alignment scan substantially in the direction of the long axis over the encoder scale 1800 as shown in FIG. 2 gives two periodic signals from each encoder scale. These two signals can be detected and distinguished from each other by the electronics of the sensor. As discussed above, this may be a self-referencing sensor. As a result, two alignment positions are found: $X_a$ and $X_b$.

Figure 20:
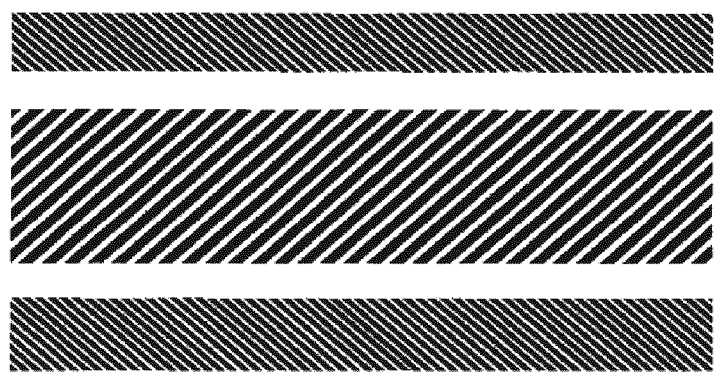
FIG. 20 illustrates an alternative embodiment of an encoder scale's microstructure.

In FIG. 18, the first area I is discussed as being adjacent to the second area II and third area III. FIG. 20 illustrates an alternative embodiment, in which the first area I may be separated or spaced from both the second area II and third area III by respective gaps. These gaps may be, for example, on the order of 1 μm each. Each gap lacks a signal generating mark structure. The gaps eliminate any overlap that may otherwise occur with mark structures being situated directly adjacent to each other. As a result, the encoder scale microstructure may be better suited for accurate, fine adjustment.

The determination of alignment positions $X_a$ and $X_b$ using an encoder scale, such as encoder scale 1800, is discussed with respect to substrate marks having a microstructure in U.S. Pat. No. 8,208,121, which is incorporated herein by reference in its entirety.

Figure 21:
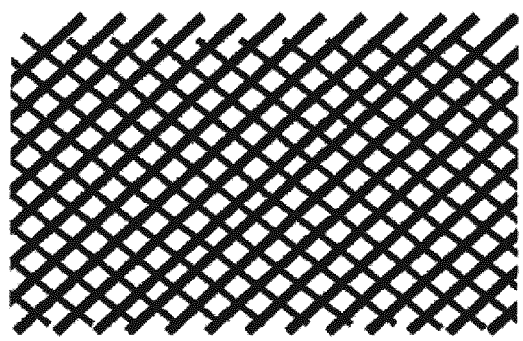
FIG. 21 illustrates an alternative exemplary embodiment of an encoder scale's microstructure that has substantially overlapping alignment structures.

In an alternative embodiment, one grid having Pitch A and another grid having Pitch B, each as shown in FIG. 18, may be printed into each other as shown in FIG. 21 so as to substantially overlap. This design has better overlap for the grids of each pitch and may have better capture properties than the microstructure configuration of the encoder scale 1800 of FIG. 18. The design in FIG. 21 allows better overlap for any Y position and less position-dependent structure variations within the sensor.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a projection system configured to project a pattern imparted to a radiation beam onto a substrate;
   a substrate table constructed to hold the substrate;
   a support plate configured to bond with a surface of a patterning device, wherein the patterning device has a patterned side having the pattern; and
   a chuck constructed to removably support the support plate and to position the support plate,
   wherein the support plate is arranged to couple the patterning device to the chuck, and the support plate is transparent to the radiation beam.

2. The lithographic apparatus of claim 1, further comprising an encoder scale connected to the support plate.

3. The lithographic apparatus of claim 1, wherein the support plate is arranged to bond with the patterned side.

4. The lithographic apparatus of claim 1, wherein the support plate is arranged to bond with a side of the patterning device other than the patterned side.

5. The lithographic apparatus of claim 4, wherein the support plate has a vacuum groove arranged to clamp the patterning device by an entirety of the side of the patterning device other than the patterned side.

6. The lithographic apparatus of claim 1, wherein the support plate comprises a piezoelectric material configured to bend the patterning device.

7. The lithographic apparatus of claim 6, further comprising a strain gauge coupled to the support plate, the strain gauge arranged to measure a curvature of the support plate.

8. The lithographic apparatus of claim 1, further comprising a first encoder scale and a second encoder scale, wherein the first encoder scale and the second encoder scale are arranged opposite to each other at vertical sides of the patterning device, wherein the vertical sides are perpendicular to the patterned side.

9. The lithographic apparatus of claim 8, wherein the first encoder scale and the second encoder scale are flexure mounted to the chuck.

10. The lithographic apparatus of claim 8, further comprising a first encoder head and a second encoder head, wherein the first encoder head is arranged to interact with the first encoder scale, the second encoder head is arranged to interact with the second encoder scale, and the first encoder head and the second encoder head are located on either side of the patterning device along an axis.

11. The lithographic apparatus of claim 10, wherein the first encoder head and the second encoder head are arranged to measure a position of the patterning device relative to the chuck.

12. The lithographic apparatus of claim 11, further comprising a servo loop to adjust a position of the chuck based on a feedback acquired from the first encoder head and the second encoder head.

13. The lithographic apparatus of claim 10, wherein the first encoder head and the second encoder head are 2D encoder heads.

14. The lithographic apparatus of claim 10, further comprising two additional encoder scales, so as to provide an encoder scale for four vertical sides of the patterning device, and further comprising two additional encoder heads arranged to interact with the two additional encoder scales.

15. A lithographic apparatus, comprising:
   a projection system configured to project a pattern imparted to a radiation beam onto a substrate;
   a substrate table constructed to hold the substrate;
   a plate transparent to the radiation beam, having a width wider than a major surface of a patterning device and having a surface arranged to couple to the major surface of the patterning device, the plate being transparent to the radiation beam; and
   a chuck constructed to removably support the plate and to position the plate,
   wherein the support plate is arranged to couple the patterning device to the chuck.

16. The lithographic apparatus of claim 15, further comprising an encoder scale connected to the plate.

17. The lithographic apparatus of claim 15, wherein the plate has a groove arranged to clamp the patterning device to the plate.

18. The lithographic apparatus of claim 15, further comprising a first encoder scale and a second encoder scale, wherein the first encoder scale and the second encoder scale are arranged opposite to each other at vertical sides of the patterning device, wherein the vertical sides are perpendicular to the patterned side.

19. The lithographic apparatus of claim 18, wherein the first encoder scale and the second encoder scale are flexure mounted to the chuck.

20. The lithographic apparatus of claim 15, wherein the support plate comprises a piezoelectric material configured to bend the patterning device.

21. A device manufacturing method, comprising:
   removably supporting a support plate and a patterning device on a chuck, the support plate having a surface arranged to couple to a major surface of the patterning device, the support plate arranged to couple the patterning device to the chuck, and the support plate being transparent to a radiation beam;
   positioning the support plate using the chuck;
   imparting a pattern to the radiation beam by the patterning device; and
   projecting the patterned radiation beam onto a substrate.

* * * * *